United States Patent
Hong et al.

(10) Patent No.: US 7,514,736 B2
(45) Date of Patent: Apr. 7, 2009

(54) SEMICONDUCTOR DEVICE HAVING A CAPACITOR AND A FABRICATION METHOD THEREOF

(75) Inventors: Sung-hun Hong, Suwon-si (KR); Myoung-hee Han, Yongin-si (KR); Jong-seop Lee, Osan-si (KR)

(73) Assignee: Samsung Electronics Co., Ltd (KR)

( * ) Notice: Subject to any disclaimer, the term of this patent is extended or adjusted under 35 U.S.C. 154(b) by 299 days.

(21) Appl. No.: 11/446,674

(22) Filed: Jun. 5, 2006

(65) Prior Publication Data
US 2006/0284232 A1    Dec. 21, 2006

(30) Foreign Application Priority Data
Jun. 16, 2005    (KR) .................... 10-2005-0052021

(51) Int. Cl.
*H01L 27/108* (2006.01)
(52) U.S. Cl. ..................... 257/296; 257/68; 257/71; 257/E27.084; 257/E21.646
(58) Field of Classification Search ........... 438/239, 438/393, 396, 257, 211, 593; 257/68, 71, 257/296–312, E27.084, E21.646
See application file for complete search history.

(56) References Cited

U.S. PATENT DOCUMENTS

| | | | |
|---|---|---|---|
| 5,488,007 A | 1/1996 | Kim et al. ................... | 438/698 |
| 5,965,939 A | 10/1999 | Kim et al. ................... | 257/752 |
| 2003/0184705 A1* | 10/2003 | Murade et al. .............. | 349/158 |
| 2005/0145993 A1* | 7/2005 | Sasaki et al. ................ | 257/620 |

FOREIGN PATENT DOCUMENTS

| | | |
|---|---|---|
| KR | 100230350 | 8/1999 |
| KR | 10-2002-0078432 | 10/2002 |
| KR | 10-2002-0094223 | 12/2002 |

* cited by examiner

*Primary Examiner*—Michelle Estrada
(74) *Attorney, Agent, or Firm*—Mills & Onello LLP

(57) ABSTRACT

In a semiconductor device having a capacitor and a method of fabricating the same, the semiconductor device comprises a semiconductor substrate having a memory cell array region and a peripheral region, a plurality of capacitors in the memory cell array region each having a storage electrode, a dielectric layer on the storage electrode, and a plate electrode on the dielectric layer, wherein an extended portion of the plate electrode extends in a direction toward the peripheral region, a dummy pattern in the peripheral region at an elevation above the semiconductor substrate that is substantially the same as that of the extended portion of the plate electrode and spaced apart from the extended portion of the plate electrode, an insulating layer formed on the plurality of capacitors in the cell array region and formed on the dummy pattern in the peripheral region, a first metal contact through the insulating layer between the extended portion of the plate electrode and the dummy pattern.

28 Claims, 9 Drawing Sheets

CELL REGION ←→ PERIPHERAL REGION

SEMICONDUCTOR DEVICE HAVING A CAPACITOR AND A FABRICATION METHOD THEREOF

RELATED APPLICATION

This application claims priority to Korean Patent Application number 10-2005-0052021, filed in the Korean Intellectual Property Office on Jun. 16, 2005, the contents of which are incorporated herein in their entirety by reference.

BACKGROUND OF THE INVENTION

1. Field of the Invention

The present invention relates to a semiconductor device having a capacitor and a fabrication method thereof. More particularly, this application relates to a semiconductor device having a dummy pattern that prevents formation of a crack in an insulating layer and a fabrication method thereof.

2. Description of the Related Art

Semiconductor memory devices, in particular, dynamic random access memory (DRAM) devices, commonly include capacitors for storing data in unit cells. More particularly, a unit cell of a DRAM device consists of a cell capacitor and an access transistor which is directly connected to the cell capacitor. The capacitance value of the capacitor is a primary factor in its data storage capability.

With the continuing trend toward increased integration density in semiconductor devices, the device area occupied by a unit cell has been decreased dramatically. With decreased capacitor size, the capacitance of the unit cell capacitor becomes smaller, which results in a reduced capability for storing unit cell data. Specifically, under certain circumstances, a unit cell can lose the data that was stored in the cell, causing functional errors in the memory device. Therefore, it is desired that the capacitance value of a unit cell capacitor be maintained, even with reduced capacitor size due to higher integration, in order to maintain proper device function in a high-density device.

A capacitor generally comprises a storage electrode that functions as a lower electrode, a dielectric layer, and a plate electrode that functions as an upper electrode. It is well known that by increasing the surface area of a unit cell capacitor's storage electrode, an increase in the capacitance value of the unit cell capacitor can be achieved. For example, in the case of a stacked storage electrode or a cylindrical storage electrode, the capacitance of the unit cell can be increased by increasing the height of the storage electrode. Therefore, in order to form a capacitor having an increased capacitance value in the same area of a unit cell, in contemporary embodiments, a COB (Capacitor Over Bit-line) structure including a capacitor formed under a bit-line and a CUB (Capacitor Under Bit-line) structure including a capacitor formed over a bit-line are employed, with the COB structure being more popular than the CUB structure, since it results in higher capacitance values and higher integration.

However, in the case of the COB structure, increasing the height of the storage electrode can result in several problems. One of the problems is that the difference in height between a memory cell region and a peripheral region occurs because the plurality of capacitors are formed only in the memory cell region. Thereafter, when a planarizing process for an insulating layer formed on the capacitor is performed, for example, a CMP (Chemical Mechanical Polishing) process, cracking of the insulating layer can occur at the boundary between the memory cell region and the peripheral region.

FIG. 1A is a cross-sectional TEM (Transmission Electron Microscope) image illustrating a conventional method of fabricating a semiconductor device having a cylindrical storage electrode.

Referring to FIG. 1A, an insulating layer 20 is deposited on a plurality of capacitors 10 in a memory cell region and on a semiconductor substrate in a peripheral region. In order to reduce the height difference between the memory cell region and the peripheral region, a planarizing process is performed after the insulating layer 20 is conformally deposited on the semiconductor substrate including the plurality of capacitors.

FIG. 1B is a planar TEM image after the planarizing process is performed. As can be seen in a circle B of the FIG. 1B, a crack is formed in the insulating layer along the boundary between the memory cell region and the peripheral region. The crack occurs because of a groove that is formed at the boundary in circle A of the FIG. 1A as a result of the height difference between the memory cell region and the peripheral region. Such a crack can result in a functional error of the semiconductor device, in turn decreasing the reliability of the device.

SUMMARY OF THE INVENTION

The present invention provides a semiconductor memory device having a plurality of capacitors that addresses the limitations of the conventional embodiments described above. In particular, the likelihood of a crack being formed in the insulating layer at a boundary between a memory cell region and a peripheral region of the device is substantially reduced or eliminated.

The present invention further provides a method of fabricating a semiconductor memory device having a plurality of capacitors in a manner that reduces or eliminates the likelihood of a crack being formed in the insulating layer at a boundary between a memory cell region and a peripheral region of the device.

In one aspect, the present invention is directed to a semiconductor memory device comprising: a semiconductor substrate having a memory cell array region and a peripheral region; a plurality of capacitors in the memory cell array region, each having a storage electrode, a dielectric layer on the storage electrode, and a plate electrode on the dielectric layer; wherein an extended portion of the plate electrode extends in a direction toward the peripheral region; a dummy pattern in the peripheral region having a base that is at an elevation above the semiconductor substrate that is substantially the same as a base of the extended portion of the plate electrode and spaced apart from the extended portion of the plate electrode; an insulating layer formed on the plurality of capacitors in the cell region and formed on the dummy pattern in the peripheral region; a first metal contact through the insulating layer between the extended portion of the plate electrode and the dummy pattern.

In one embodiment, the semiconductor device further comprises a second metal contact through the insulating layer spaced apart from the first metal contact and at a side of the dummy pattern opposite the first metal contact.

In another embodiment, the dummy pattern comprises the same material as that of the plate electrode.

In another embodiment, the dummy pattern comprises at least one selected from a group consisting of a polysilicon layer and a metal layer.

In another embodiment, the dummy pattern comprises a polysilicon layer and a TiN (Titanium Nitride) layer.

In another embodiment, the dummy pattern is spaced about 500-2000 nm apart from the extended portion of the plate electrode.

In another embodiment, the dummy pattern has a width of about 100-1000 nm.

In another embodiment, the insulating layer is selected from a group consisting of a FOX (Flowable Oxide), TOSZ (Tonen Silazene), USG (Undoped Silicate Glass), BSG (Boro Silicate Glass), PSG (Phospho Silicate Glass), BPSG (Boro-Phospho Silicate Glass), PE-TEOS (Plasma Enhanced-Tetra Ethyl Ortho Silicate), FSG (Fluoride Silicate Glass), and an HDP (High Density Plasma) layer.

In another embodiment, the dummy pattern comprises a multiple layer of a polysilicon layer and a TiN (Titanium Nitride) layer, and wherein the insulating layer comprises a PE-TEOS layer.

In another embodiment, the dummy pattern is a line type pattern.

In another embodiment, the storage electrode has a cylindrical shape.

In another embodiment, the thickness of the dummy pattern has a thickness that is greater than a thickness of the extended portion of the plate electrode.

In another embodiment, the thickness of the dummy pattern is at least 1.5 times the thickness of the extended portion of the plate electrode.

In another aspect, the present invention is directed to a method of fabricating a semiconductor memory device comprising; providing a semiconductor substrate having a memory cell array region and a peripheral region; forming a plurality of capacitors in the memory cell array region, wherein forming the plurality of capacitors comprises forming storage electrodes, forming a dielectric layer on the storage electrodes, and forming a plate electrode on the dielectric layer, wherein an extended portion of the plate electrode extends in a direction toward the peripheral region; forming a dummy pattern in the peripheral region having a base at an elevation above the semiconductor substrate that is substantially the same as a base of the extended portion of the plate electrode, and spaced apart from the extended portion of the plate electrode; forming an insulating layer on the plurality of capacitors in the cell array region and on the dummy pattern in the peripheral region; and forming a first metal contact through the insulating layer between the extended portion of the plate electrode and the dummy pattern.

In one embodiment, the method of fabricating a semiconductor memory device further comprises forming a second metal contact through the insulating layer spaced apart from the first metal contact and at a side of the dummy pattern opposite the first metal contact.

In another embodiment, the dummy pattern comprises the same material as that of the plate electrode.

In another embodiment, the dummy pattern is formed simultaneously with the plate electrode.

In another embodiment, the dummy pattern comprises at least one selected from a group consisting of a polysilicon layer and a metal layer.

In another embodiment, the dummy pattern comprises a polysilicon layer and a TiN layer.

In another embodiment, the dummy pattern is spaced about 500-2000 nm apart from the extended portion of the plate electrode.

In another embodiment, the dummy pattern has a width of about 100-1000 nm.

In another embodiment, after forming the insulating layer, the method further comprises removing a portion of the insulating layer in the memory cell array region and planarizing any remaining insulating layer in a CMP process.

In another embodiment, the insulating layer is selected from a group consisting of a FOX (Flowable Oxide), TOSZ (Tonen Silazene), USG (Undoped Silicate Glass), BSG (Boro Silicate Glass), PSG (Phospho Silicate Glass), BPSG (Boro-Phospho Silicate Glass), PE-TEOS (Plasma Enhanced-Tetra Ethyl Ortho Silicate), FSG (Fluoride Silicate Glass), and an HDP (High Density Plasma) layer.

In another embodiment, the dummy pattern comprises a multiple layer of a polysilicon layer and a TiN (Titanium Nitride) layer, wherein the insulating layer comprises a PE-TEOS (Plasma Enhanced Tetra Ethyl Ortho Silicate) layer.

In another embodiment, the insulating layer is formed in a process selected from a group consisting of an ALD (Atomic Layer Deposition), PEALD (Plasma Enhanced Atomic Layer Deposition), MOCVD (Metal Organic Chemical Vapor Deposition), and a PECVD (Plasma Enhanced Chemical Vapor Deposition) process.

In another embodiment, the dummy pattern is a line-type pattern.

In another embodiment, the storage electrode has a cylindrical shape.

In another embodiment, the thickness of the dummy pattern has a thickness that is greater than a thickness of the extended portion of the plate electrode.

In another embodiment, the thickness of the dummy pattern is at least 1.5 times of the thickness of the extended portion of the plate electrode.

BRIEF DESCRIPTION OF THE DRAWINGS

The above features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
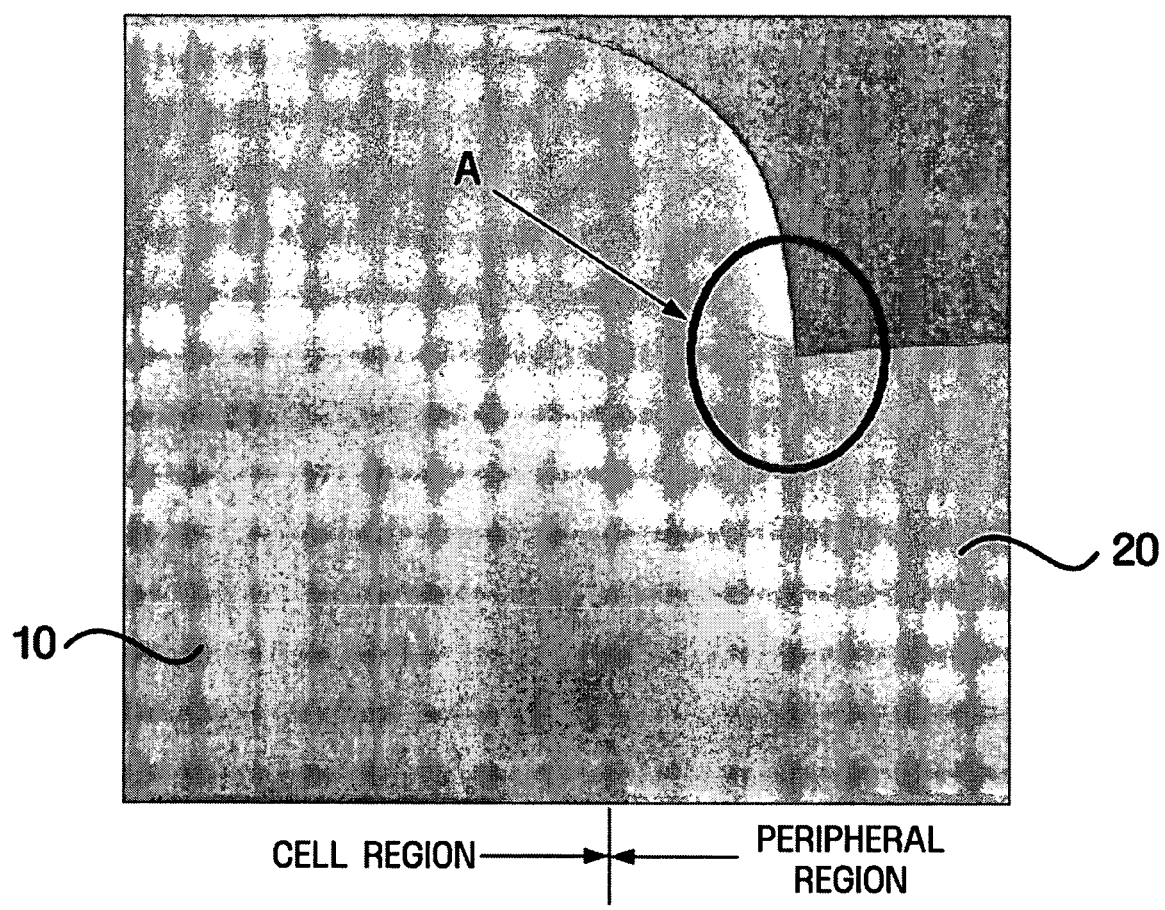
FIG. 1A is a cross-sectional TEM (Transmission Electron Microscope) image that illustrates a conventional method of fabricating a semiconductor device having a cylindrical storage electrode.
Figure 1B:
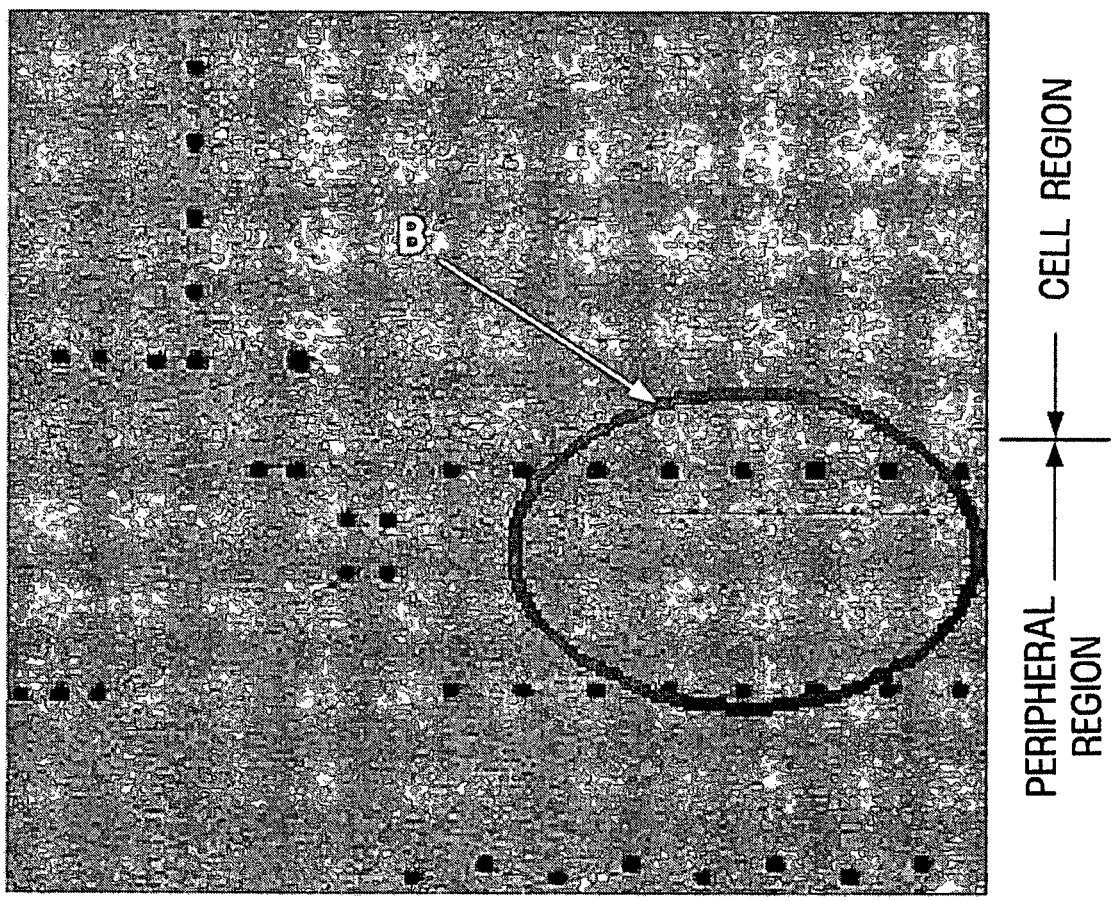
FIG. 1B is a planar TEM image taken following performing a planarizing process of an insulating layer on a plurality of capacitors at the boundary between a cell region and a peripheral region of the device.

The present invention will now be described more fully hereinafter with reference to the accompanying drawings, in which exemplary embodiments of the invention are shown. The invention may, however, be embodied in different forms and should not be construed as limited to the embodiments set fourth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters in different drawings represent like elements throughout. Further, throughout the drawings, a left portion of the figure illustrates a cell region of a semiconductor device and a right portion of the figure illustrates a peripheral circuit region of the semiconductor device.

The present invention can be applied to a semiconductor device having a number of different configurations, including, most notably, a CUB (Capacitor Under Bit-line) structure having capacitors that are formed under bit-lines or a COB (Capacitor Over Bit-line) structure having capacitors that are formed over bit-lines. In addition, the present invention can be applied to a semiconductor memory device having a capacitor storage electrode of a number of different geometries, including a cylindrical type, box type, or fin type geometry.

Figure 2:
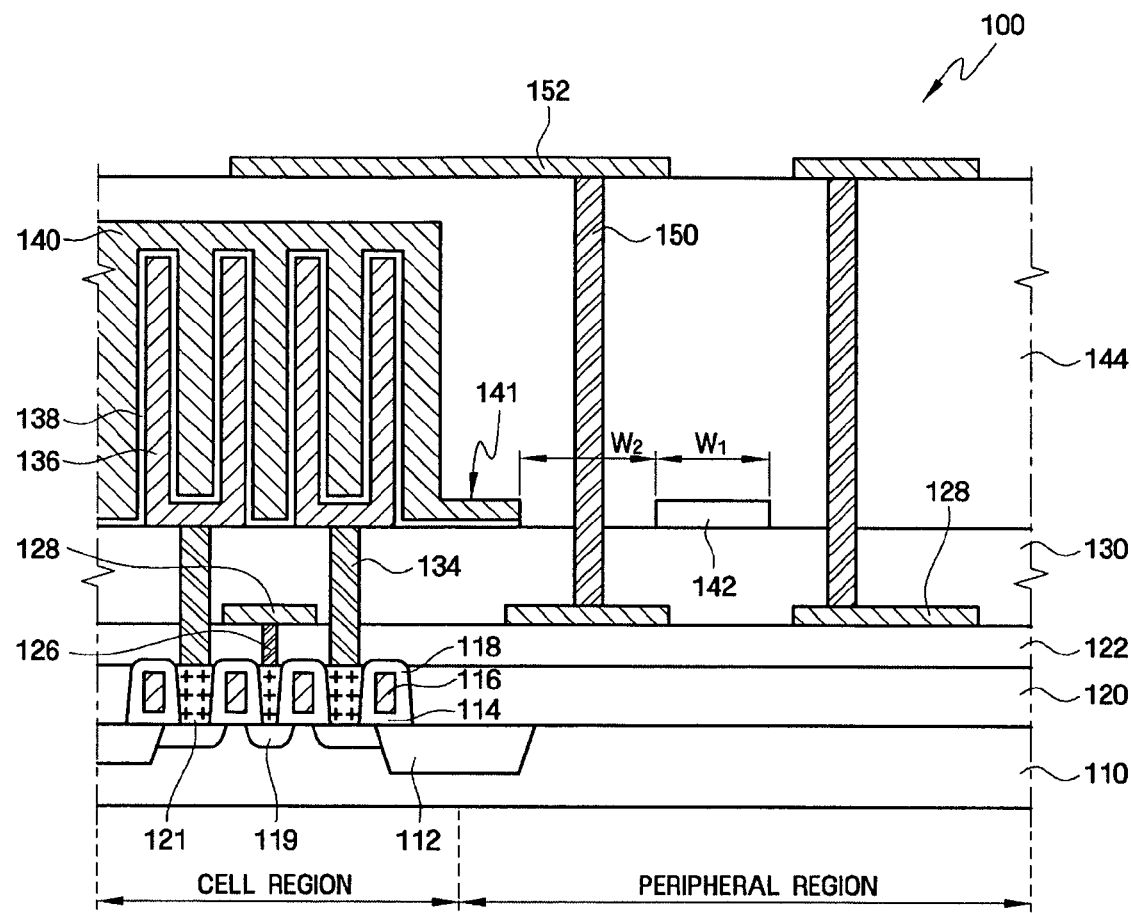
FIG. 2 is a cross-sectional view of a semiconductor memory device in accordance with an embodiment of the present invention.

FIG. 2 is a cross-sectional view of a semiconductor memory in accordance with an embodiment of the present invention. In this embodiment, a COB structure is shown, an a cylindrical type capacitor is employed.

Referring to FIG. 2, an isolation region 112, which separates a memory cell array region and a peripheral region, is formed on a semiconductor substrate 110. The semiconductor substrate can be formed of a substrate material selected from the group consisting of a silicon substrate, SOI (Silicon on Insulator) substrate, Gallium-Arsenic substrate, Silicon-Germanium substrate, Ceramic substrate, quartz substrate, and a glass substrate, for example, for a purpose of display. The isolation region 112 can be formed, for example, by one of a LOCOS (Local Oxidation of Silicon), improved LOCOS, or STI (Shallow Trench Isolation) process.

In order to form a transistor in the memory cell region, a gate dielectric layer 114 is formed on the semiconductor substrate in the memory cell array region. A gate electrode 116 which consists of a polysilicon layer is formed on the gate dielectric layer. An insulative spacer 118 is formed on the sidewalls of the gate electrode. Source/drain regions 119 are formed in the semiconductor substrate by implanting impurities in the substrate 110 using the spacers 118 as a self-aligned implantation mask.

Self-aligned contact plugs 121, which are in contact with the source/drain regions 119, are formed on the semiconductor substrate 110. A first inter-layer dielectric layer 120 is formed on the resulting transistor. The first inter-layer dielectric layer 120 can be formed, for example, of a material selected from the group consisting of a FOX (Flowable Oxide), TOSZ (Tonen Silazene), USG (Undoped Silicate Glass), BSG (Boro Silicate Glass), PSG (Phospho Silicate Glass), BPSG (Boro-Phospho Silicate Glass), PE-TEOS (Plasma Enhanced-Tetra Ethyl Ortho Silicate), FSG (Fluoride Silicate Glass), and an HDP (High Density Plasma) layer. The first inter-layer dielectric layer 120 can be formed, for example, using an ALD (Atomic Layer Deposition), PEALD (Plasma Enhanced Atomic Layer Deposition), MOCVD (Metal Organic Chemical Vapor Deposition), or a PECVD (Plasma Enhanced Chemical Vapor Deposition) process.

A second inter-layer dielectric layer 122 is formed on the first inter-layer dielectric layer 120 and the self-aligned contact plugs 121. The second inter-layer dielectric layer 122 can be formed, for example, of a material selected from the group consisting of a FOX, TOSZ, USG, BSG, PSG, BPSG, PE-TEOS, FSG, and an HDP layer. The second inter-layer dielectric layer can be formed, for example, using a CVD (Chemical Vapor Deposition) process.

A bit-line contact plug 126, which connects a bit-line 128 formed on the second inter-layer dielectric layer 122 with the underlying self-aligned contact plug formed on the drain region, is formed in the second inter-layer dielectric layer 122. The bit-line contact plug 126 can be formed, for example, of at least one material selected from the group consisting of Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, and $IrO_2$.

A third inter-layer dielectric layer 130 is formed on the second inter-layer dielectric layer. The third inter-layer dielectric layer 130 can be formed, for example, of a material selected from the group consisting of a FOX, TOSZ, USG, BSG, PSG, BPSG, PE-TEOS, FSG, and an HDP layer. The third inter-layer dielectric layer can 130 be formed, for example, by a CVD (Chemical Vapor Deposition) process.

Storage electrode contact plugs 134, that connect capacitor storage electrodes 136 formed on the third inter-layer dielectric layer 130 with the self-aligned contact plugs 121 formed on the source region, are formed through the second and the third inter-layer dielectric layers 122, 130. The storage electrode contact plugs 134 can consist of a conductive layer, for example, a polysilicon layer.

The capacitor storage electrodes 136 are formed on the third inter-layer dielectric layer 130, for example in a cylindrical geometry. The capacitor storage electrodes 136 consist of a conductive material, for example, a polysilicon and/or a metal material. In the case of a metal material for the capacitor storage electrodes, it can be formed, for example, of at least one material selected from the group consisting of Rh, Os, Pd, Pt, W, Mo, Ti, Ta, Al, Cu, Hf, Zr, Ir, WN, MoN, TiN, TaN, AlN, HfN, ZrN, TaSiN, RuO2, and IrO2. The capacitor storage electrodes can further optionally be formed to include a multiple layered configuration including a metal layer and a polysilicon layer.

A dielectric layer 138 is conformally formed on the capacitor storage electrodes 136 according to the shape of the storage electrode. The dielectric layer 138 is formed using a high-dielectric-constant material having strong ionic polarization characteristics in order to maintain a high capacitance value. The dielectric layer can have a laminate structure and can be formed, for example, of at least one selected from the group consisting of a $HfO_2$, HfSiO, HfAlO, ZrSiO, ZrAlO, $Ta_2O_5$, $TiO_2$, $Al_2O_3$, $NV_2O_5$, $CeO_2$, $Y_2O_3$, $InO_3$, $IrO_2$, $SrTiO_3$, $PbTiO_3$, $SrRuO_3$, $CaRuO_3$, $(Ba, Sr)TiO_3$, $Pb(Zr, Ti)O_3$, $(Pb, La)(Zr, Ti)O_3$, $(Sr, Ca)RuO_3$. The dielectric layer has a thickness about 1 to 15 nm and can be formed, for example by a CVD (Chemical Vapor Deposition) process.

A capacitor plate electrode 140 is formed on the dielectric layer 138 in the memory cell array region and has an extended portion that extends in a direction toward the peripheral region. The capacitor plate electrode 140 can be formed, for example, of at least one material selected from the group consisting of Rh, Os, Pd, Pt, W, Mo, Ti, Ta, Al, Cu, Hf, Zr, Ir, WN, MoN, TiN, TaN, AlN, HfN, ZrN, TaSiN, $RuO_2$, and $IrO_2$. The capacitor plate electrode can consist of a multi-layered structure including a metal layer and a polysilicon layer, for example, a TiN and polysilicon layer.

A dummy pattern 142 is formed on the third inter-layer dielectric layer 130 in the peripheral region such that a bottom portion, bottom surface, or base, of the dummy pattern 142 is at substantially the same elevation above the semiconductor substrate 110 as a bottom portion, bottom surface, or base, of the extended portion 141 of the plate electrode and such that the dummy pattern 142 is spaced apart from the extended portion 141 of the plate electrode. The dummy pattern 142 is effective to prevent cracking at the boundary between the memory cell region and the peripheral region during a later planarization process of a fourth inter-layer dielectric layer 144 which is later formed on the third inter-layer dielectric layer 130.

In order to simplify the method of fabricating the semiconductor memory device, the dummy pattern 142 can be formed of the same material and at the same time as those of the capacitor plate electrode 140. Alternatively, the dummy pattern 142 can be formed of a different material than that of the capacitor plate electrode 140, or can be formed during a different process than that of the capacitor plate electrode 140. In this case, the dummy pattern 142 can have a different thickness than that of the capacitor plate electrode 140. The dummy pattern can have a width (W1) of about 100 to 1000 nm in order to effectively prevent the cracking phenomenon. The dummy pattern can have a thickness of at least 1.5 times of the thickness of the plate electrode, for example, a thickness of about 300 nm.

The planarized fourth inter-layer dielectric layer 144 is formed on the plate electrode 140 and the dummy pattern 142. The fourth inter-layer dielectric layer 144 is formed of a material, for example, selected from the group consisting of a FOX, TOSZ, USG, BSG, PSG, BPSG, PE-TEOS, FSG, and an HDP layer. The fourth inter-layer dielectric layer 144 can be formed, for example, by a CVD (Chemical Vapor Deposition) process and can have a thickness, for example, of about 2000 to 4000 nm. The fourth inter-layer dielectric layer 144 is then planarized and a metal line pattern 152 is formed thereon. The metal line pattern 152 can be formed, for example, of at least one material selected from the group consisting of Rh, Os, Pd, Pt, W, Mo, Ti, Ta, Al, Cu, Hf, Zr, Ir, WN, MoN, TiN, TaN, AlN, HfN, ZrN, TaSiN, RuO2, and IrO2. For example, the metal line can comprise a multi-layered structure of Ti, TiN, and Al layers.

A metal contact plug 150, which connects the metal line pattern 152 formed on the planarized fourth inter-layer dielectric layer 144 with the underlying bit-line 128 formed on the second inter-layer dielectric layer 122, is formed through the third and fourth inter-layer dielectric layers 130, 144. The metal contact plug 150 can consist, for example, of Tungsten or Tungsten alloy.

With the continuous increase in integration density of semiconductor devices, there is a corresponding need to have a metal contact plug 150 of the peripheral region placed at a short distance from the cell region, for example, close to the edge of the extended portion of the plate electrode 140. Therefore, the dummy pattern 142 should have a distance (W2) of about 500 to 2000 nm apart from the extended portion 141 of the plate electrode 140 so as to allow for the presence of such a metal contact plug 150 in close proximity to the cell region.

As shown in FIG. 2, in the case of the semiconductor memory device 100 of the present invention, and in the case of the method for forming such a device, the dummy pattern 142 does not interfere with the device's integration density because it is formed in a space between neighboring metal contact plugs 150, and is spaced apart from the extended portion 141 of the plate electrode 140 so as to accommodate the presence of a metal plug 150 between the plate electrode 140 and the dummy pattern 142.

Figure 3:
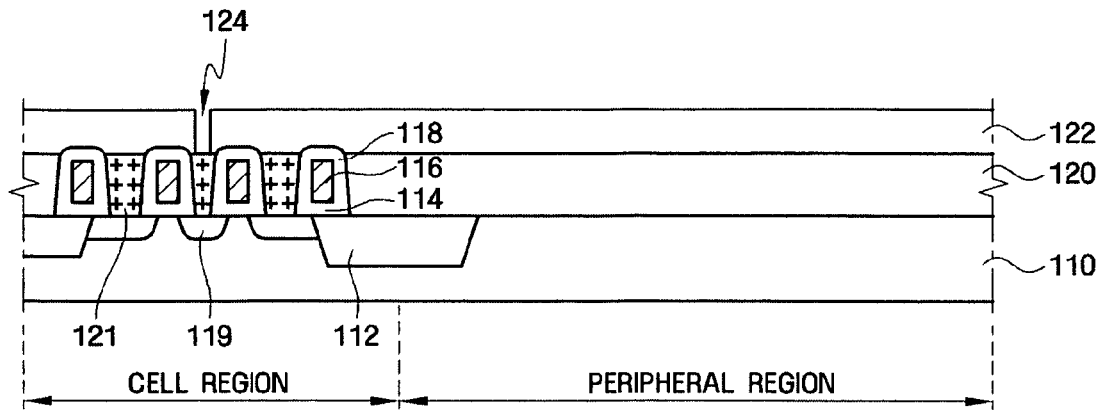
FIGS. 3 through 10 are cross-sectional views of a method of forming a semiconductor memory device in accordance with an embodiment of the present invention.

FIGS. 3 through 10 are cross-sectional views of a method of forming a semiconductor memory device in accordance with an embodiment of the present invention;

Referring to FIG. 3, a plurality of transistors, each including a gate dielectric layer 114, a gate electrode 116, a sidewall spacer 118, and source/drain regions 119, are formed on a semiconductor substrate 110 having an isolation region 112 which separates a memory cell array region and a peripheral region.

A first inter-layer dielectric layer 120 is formed on the transistors. A self-aligned contact plug 121, which is in contact with the underlying source/drain regions 119, is formed in the first inter-layer dielectric layer.

A second inter-layer dielectric layer 122 is formed on the first inter-layer dielectric layer 120. The second inter-layer dielectric layer 122 is then planarized, for example in a CMP (Chemical Mechanical Polishing) or an Etch-back process.

A bit-line contact hole 124 exposing the top surface of the self-aligned contact plug 121 that is connected to the drain region of the transistors is formed in the second inter-layer dielectric layer 122 using a mask layer (not shown in FIG. 3).

Figure 4:
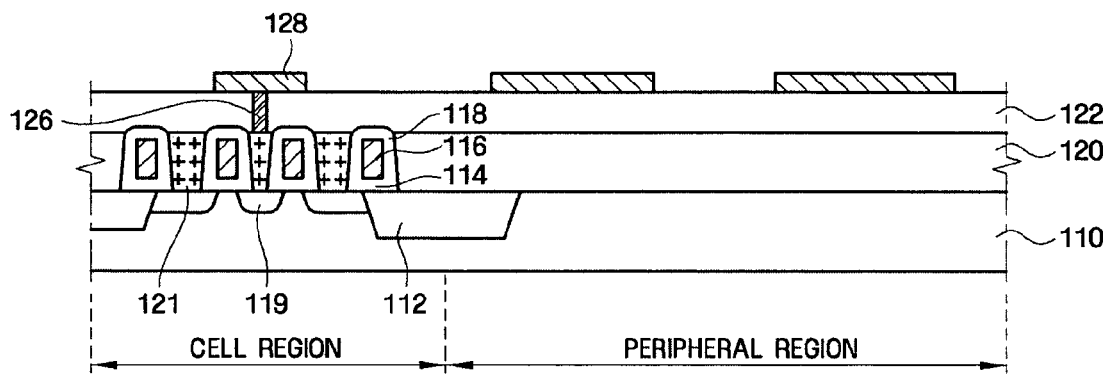

Referring to FIG. 4, a bit-line contact plug 126 is formed by filling a conductive material in the bit-line contact hole. A bit-line pattern 128, in connection with the underlying bit-line contact plug 126, is formed on the second inter-layer dielectric layer 122.

Figure 5:
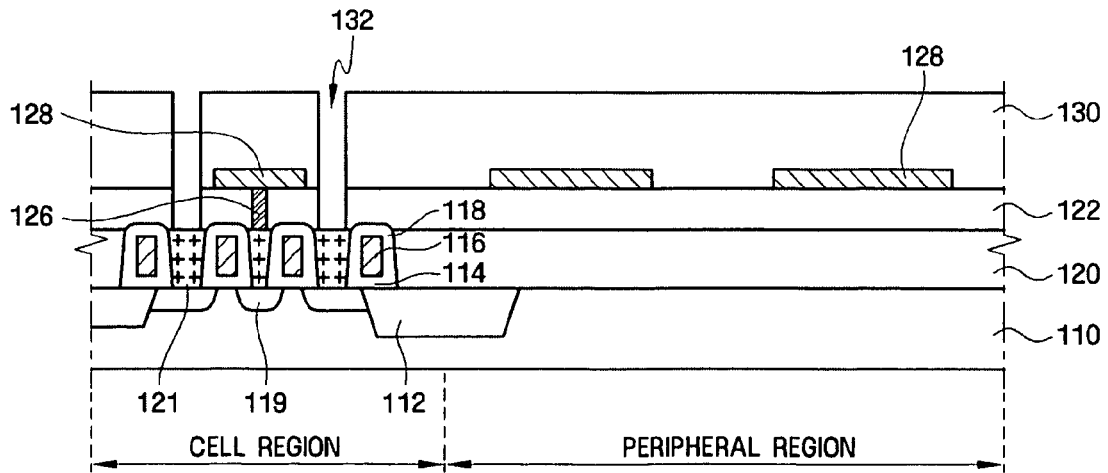

Referring to FIG. 5, a third inter-layer dielectric layer 130 is formed on the second inter-layer dielectric layer on which the bit-line pattern is formed. The third inter-layer dielectric layer 130 is then planarized, for example in a CMP (Chemical Mechanical Polishing) or an Etch-back process.

Storage electrode contact holes 132 exposing the top surface of the self-aligned contact plugs 121 which connect to the source regions of the transistors are formed through the second and third inter-layer dielectric layers 130, 122 using an etching mask (not shown).

Figure 6:
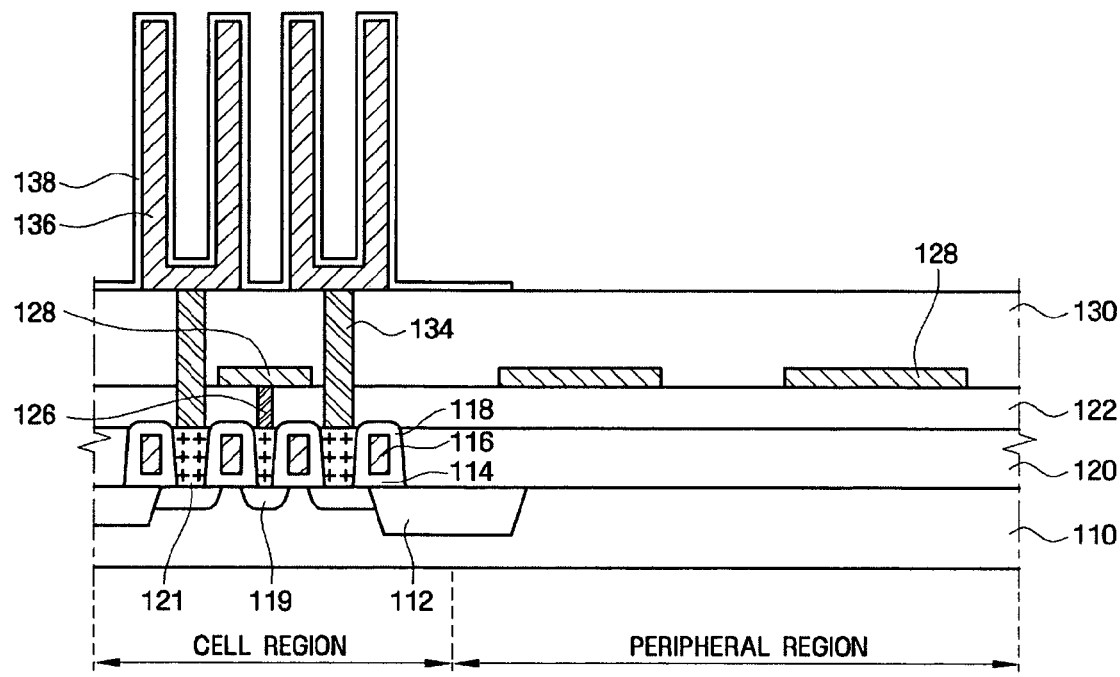

Referring to FIG. 6, storage electrode contact plugs 134 are formed by filling a conductive material in the storage electrode contact holes 132. Storage electrodes 136 in contact with the storage electrode contact plugs are then formed on the third inter-layer dielectric layer 130. A dielectric layer 138 is conformally formed on the storage electrodes 136 according to the profile of the storage electrodes 136.

Figure 7:
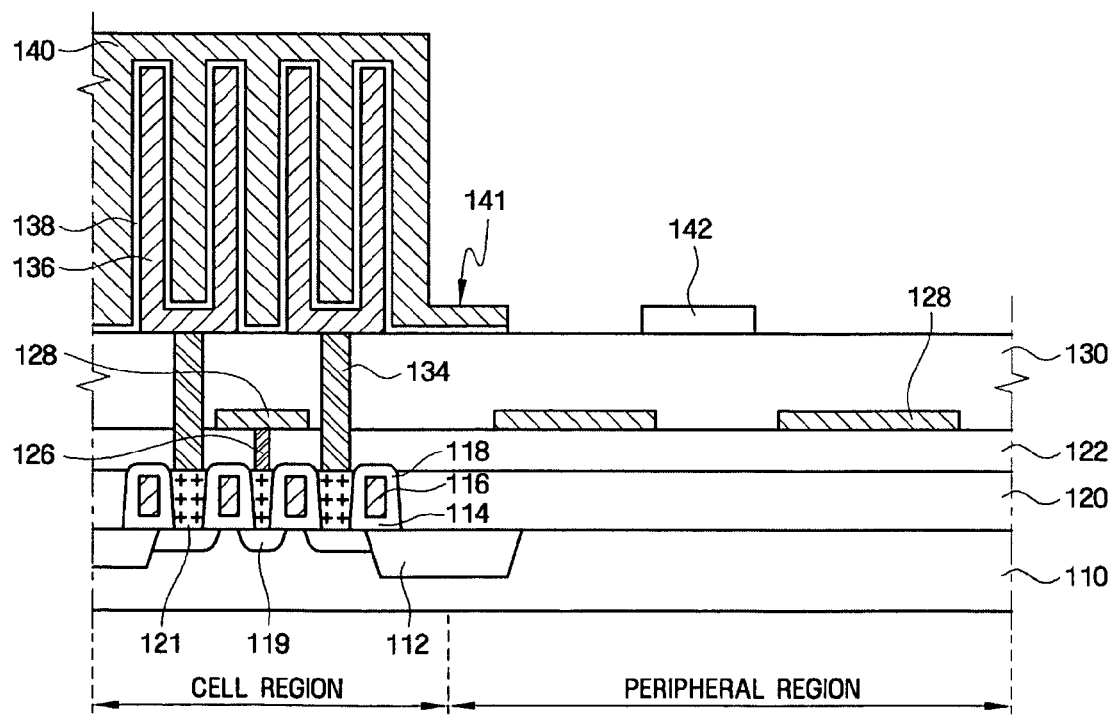

Referring to FIG. 7, a plate electrode 140 is formed on the dielectric layer 138, the plate electrode 140 including an extended portion 141 that extends on the third inter-layer dielectric 130 from the cell region toward the peripheral region. A dummy pattern 142 is formed on the third inter-layer dielectric layer 130 in the peripheral region at an elevation above the semiconductor substrate 110 such that a base, or bottom surface, of the dummy pattern 142 is at substantially the same elevation above the substrate as the base, or bottom surface, of the extended portion 141 of the plate electrode 140. The capacitor dielectric layer 138 may or may not be present under the extended portion 141 of the plate electrode 140. By describing the dummy pattern 142 as having substantially the same elevation above the substrate as the extended portion 141, this description includes both possibilities of the presence, or non-presence, of the capacitor dielectric layer 138 under the extended portion 141. In addition, the dummy pattern 142 is spaced apart from the extended portion of the plate electrode.

Figure 8:
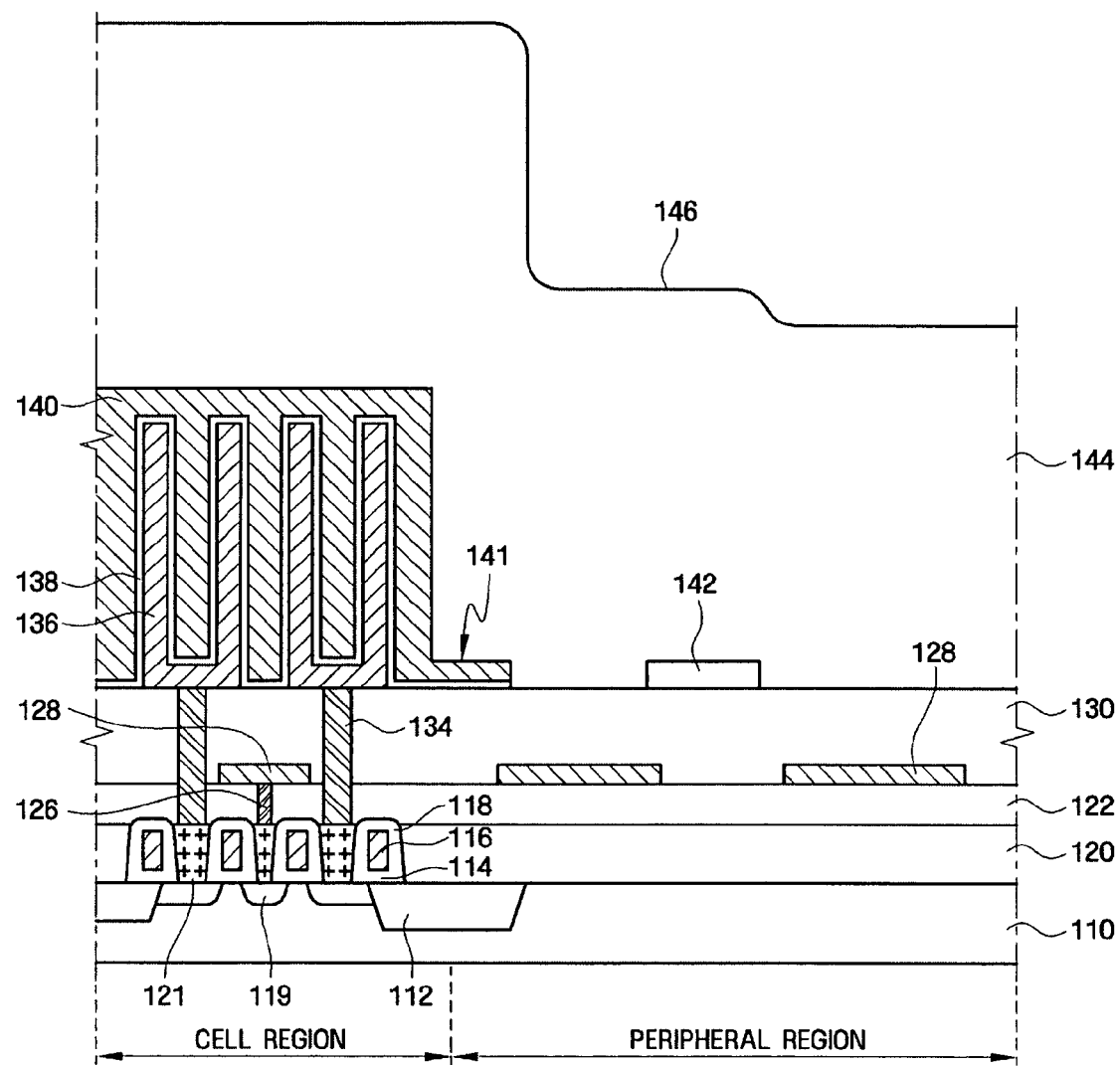

Referring to FIG. 8, the fourth inter-layer dielectric layer 144 is formed on the third inter-layer dielectric layer 130, the plate electrode 140 and the dummy pattern 142. A large height difference exists in the top surface of the fourth inter-dielectric layer 144 between the memory cell array region and the peripheral region because the capacitors having a large height are formed exclusively in the memory cell array region. In contemporary designs, the height of the capacitor can be about 2000 nm or greater. As shown in FIG. 8, in the present invention, protruding region 146 of the fourth inter-layer dielectric 146 is formed at the boundary between the memory cell array region and the peripheral region due to the presence of the underlying dummy pattern 142 formed on the third inter-layer dielectric layer 130. The protruding region 146 is effective in mitigating or eliminating the likelihood of a cracking phenomenon from being generated at the boundary between the memory cell region and the peripheral region during a later planarization process of the fourth inter-layer dielectric layer 144.

Figure 9:
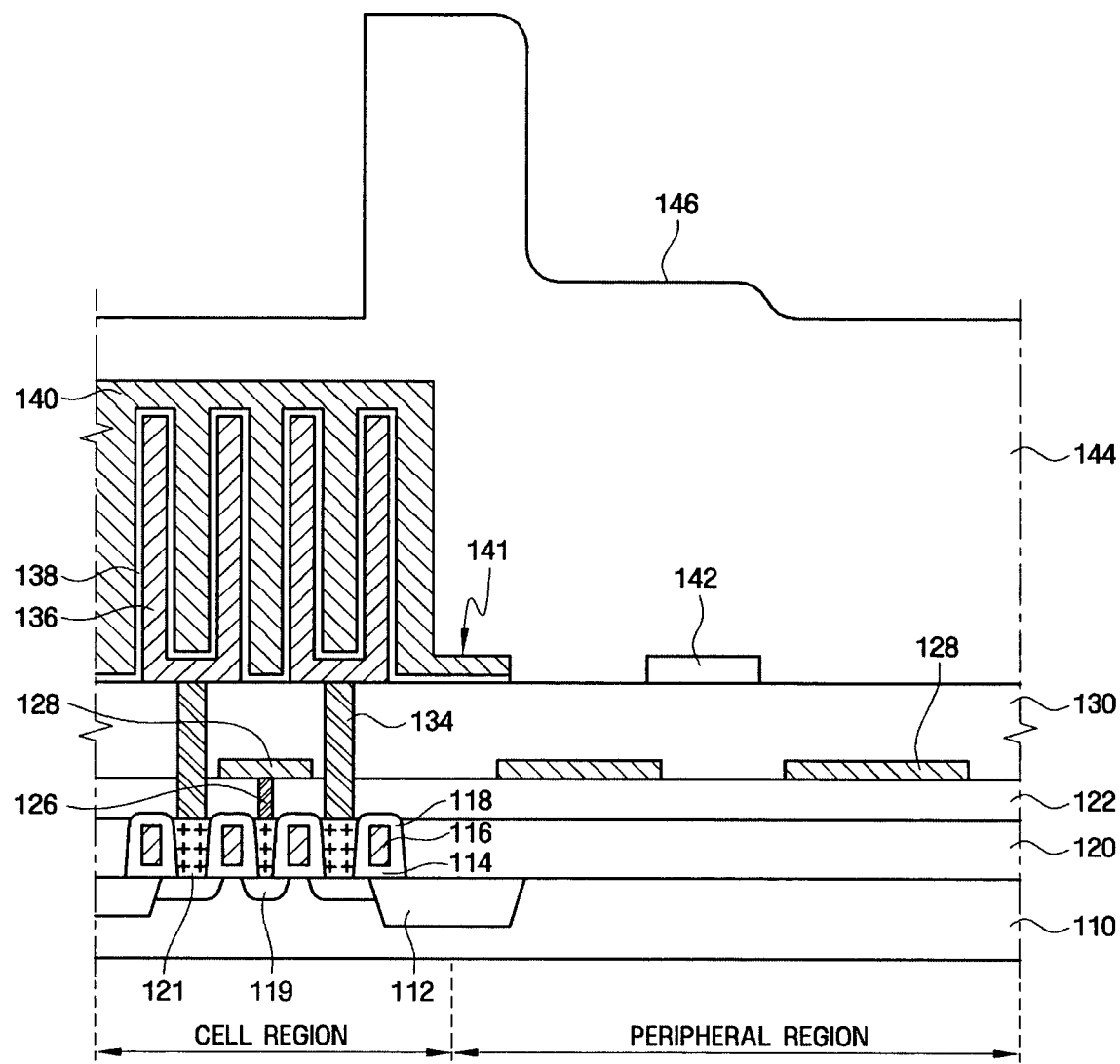

Referring to FIG. 9, a portion of the fourth inter-layer dielectric layer 146 which is formed in the memory cell array region is partially removed before the planarization process is performed for the fourth inter-layer dielectric layer 146.

Figure 10:
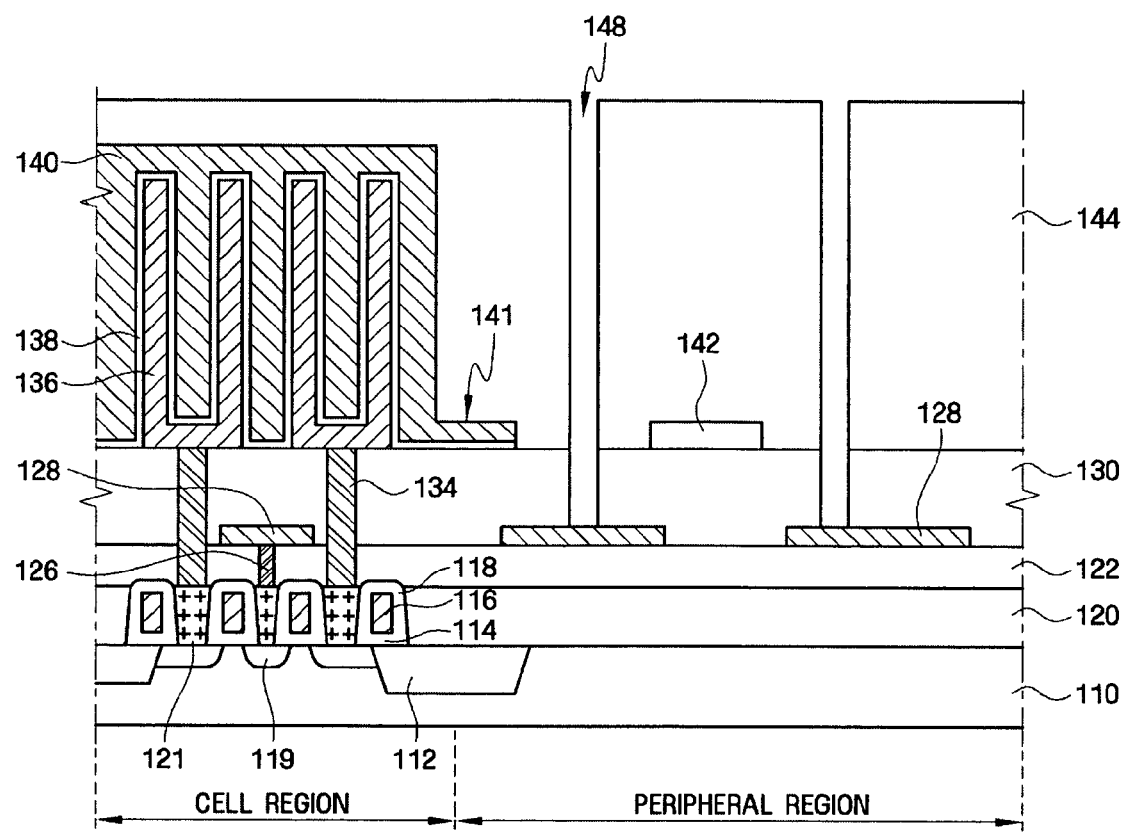

Referring to FIG. 10, the fourth inter-layer dielectric layer 146 is planarized in a CMP (Chemical Mechanical Polishing) process. Metal contact holes 148 are formed through the third and fourth inter-layer dielectric layers 130, 144. As shown in FIG. 2, metal contact plugs 150 are then formed in the metal contact holes 148 using a conductive material and a metal line pattern 152 is formed on the planarized fourth inter-layer dielectric layer 146 connecting with the underlying metal contact plug 150.

Figure 11:
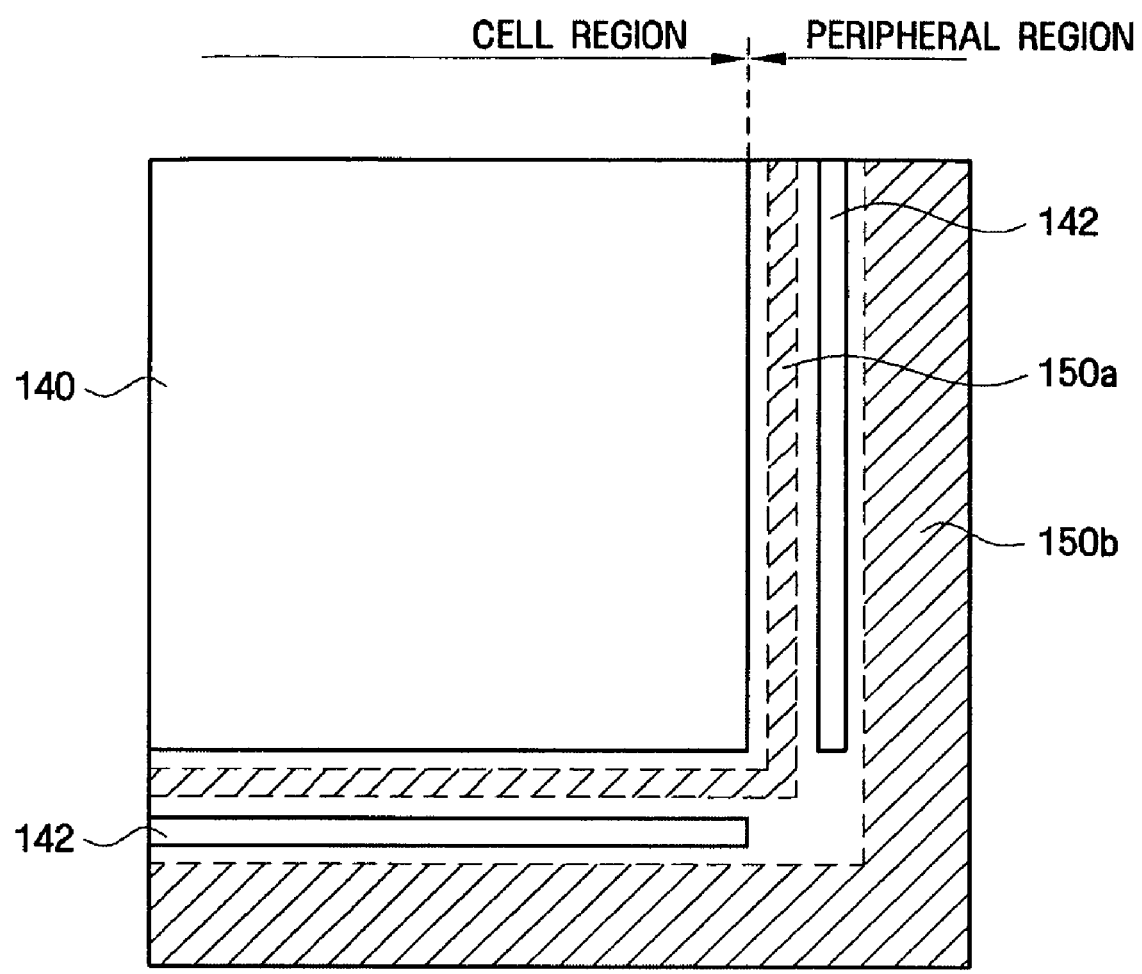
FIG. 11 is a planar layout of a semiconductor memory device in accordance with an embodiment of the present invention.

FIG. 11 is a planar layout of a semiconductor device memory in accordance with an embodiment of the present invention.

As shown in FIG. 11, the plate electrode 140 is formed in the memory cell array region, and a first metal contact region (150a) is present in the peripheral region at the boundary of the memory cell array region. There is also a second metal contact region (150b) spaced apart from the first metal contact region 150a and on opposite sides of the dummy pattern 142 which is located between the first metal contact region 150a and the second metal contact region 150b.

As mentioned above, in the case where it is desired that the first metal contact region 150a of the peripheral region be positioned relatively close to the plate electrode 140 of the capacitors of the memory cell array region, a dummy pattern 142 can be formed in the peripheral region, with the first metal contact region 150a positioned between the plate electrode 140 and the dummy pattern 142. In addition, the dummy pattern 142 can be positioned between the first metal contact region 150a and other, second, metal contact regions 150b.

As disclosed above, the present invention provides several advantages. First, the invention can effectively prevent a cracking phenomenon from occurring at the boundary between the memory cell region and the peripheral region during a planarization process of the fourth inter-layer dielectric layer 144 which is formed on the third inter-layer dielectric layer 130. The presence of the underlying dummy pattern 142 contributes toward reducing the contour or slope of the fourth inter-layer dielectric layer 144, which, in turn, reduces the likelihood of cracking during planarization at the boundary of the cell and peripheral regions.

Second, the devices and methods of the present invention do not adversely affect the integration density of the resulting device, because the first metal contact region 150a is formed in a space between the dummy pattern 142 and the capacitor plate electrode 140, and the dummy pattern 142 is formed in a space between the first metal contact region 150b and the second metal contact region 150a of the peripheral region.

Third, in one embodiment of the present invention, an additional process for forming the dummy pattern 142 is not required, as the dummy pattern 142 is formed contemporaneously with the capacitor plate electrode 140.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device, comprising:
a semiconductor substrate having a memory cell array region and a peripheral region;
a plurality of capacitors in the memory cell array region, each having a storage electrode, a dielectric layer on the storage electrode, and a plate electrode on the dielectric layer, wherein an extended portion of the plate electrode extends in a direction toward the peripheral region;
a dummy pattern in the peripheral region having a base that is at an elevation above the semiconductor substrate that is the same as a base of the extended portion of the plate electrode, and spaced apart from the extended portion of the plate electrode;
an insulating layer formed on the plurality of capacitors in the cell array region and formed on the dummy pattern in the peripheral region; and
a first metal contact through the insulating layer between the extended portion of the plate electrode and the dummy pattern, wherein the first metal contact is isolated from each of the plate electrode and the dummy pattern by the insulating layer.

2. A semiconductor device as claimed in claim 1, further comprising a second metal contact through the insulating layer spaced apart from the first metal contact and at a side of the dummy pattern opposite the first metal contact.

3. A semiconductor device as claimed in claim 1, wherein the dummy pattern comprises the same material as that of the plate electrode.

4. A semiconductor device as claimed in claim 1, wherein the dummy pattern comprises at least one selected from a group consisting of a polysilicon layer and a metal layer.

5. A semiconductor device as claimed in claim 4, wherein the dummy pattern comprises a polysilicon layer and a TiN layer.

6. A semiconductor device as claimed in claim 1, wherein the dummy pattern is spaced about 500-2000 nm apart from the extended portion of the plate electrode.

7. A semiconductor device as claimed in claim 1, wherein the dummy pattern has a width of about 100-1000 nm.

8. A semiconductor device as claimed in claim 1, wherein the insulating layer is selected from a group consisting of a FOX, TOSZ, USG, BSG, PSG, BPSG, PE-TEOS, FSG, and an HDP layer.

9. A semiconductor device as claimed in claim 8, wherein the dummy pattern comprises a multiple layer of a polysilicon layer and a TiN layer, and wherein the insulating layer comprises a PE-TEOS layer.

10. A semiconductor device as claimed in claim 1, wherein the dummy pattern is a line-type pattern.

11. A semiconductor device as claimed in claim 1, wherein the storage electrode has a cylindrical shape.

12. A semiconductor device as claimed in claim 1, wherein the dummy pattern has a thickness that is greater than a thickness of the extended portion of the plate electrode.

13. A semiconductor device as claimed in claim 12, wherein the thickness of the dummy pattern is at least 1.5 times the thickness of the extended portion of the plate electrode.

14. A method of fabricating a semiconductor memory device, comprising:

providing a semiconductor substrate having a memory cell array region and a peripheral region;

forming a plurality of capacitors in the memory cell array region, wherein forming the plurality of capacitors comprises forming storage electrodes, forming a dielectric layer on the storage electrodes, and forming a plate electrode on the dielectric layer, wherein an extended portion of the plate electrode extends in a direction toward the peripheral region;

forming a dummy pattern in the peripheral region having a base that is at an elevation above the semiconductor substrate that is the same as a base of the extended portion of the plate electrode, and spaced apart from the extended portion of the plate electrode;

forming an insulating layer on the plurality of capacitors in the cell array region and on the dummy pattern in the peripheral region; and forming a first metal contact through the insulating layer between the extended portion of the plate electrode and the dummy pattern, wherein the first metal contact is isolated from each of the plate electrode and the dummy pattern by the insulating layer.

15. A method of fabricating a semiconductor memory device as claimed in claim 14 further comprising forming a second metal contact through the insulating layer spaced apart from the first metal contact and at a side of the dummy pattern opposite the first metal contact.

16. A method of fabricating a semiconductor memory device as claimed in claim 14, wherein the dummy pattern comprises the same material as that of the plate electrode.

17. A method of fabricating a semiconductor memory device as claimed in claim 14, wherein the dummy pattern is formed simultaneously with the plate electrode.

18. A method of fabricating a semiconductor memory device as claimed in claim 14, wherein the dummy pattern comprises at least one selected from a group consisting of a polysilicon layer and a metal layer.

19. A method of fabricating a semiconductor memory device as claimed in claim 14, wherein the dummy pattern comprises a polysilicon layer and a TiN layer.

20. A method of fabricating a semiconductor memory device as claimed in claim 14, wherein the dummy pattern is spaced about 500-2000 nm apart from the extended portion of the plate electrode.

21. A method of fabricating a semiconductor memory device as claimed in claim 14, wherein the dummy pattern has a width of about 100-1000 mm 22. A method of fabricating a semiconductor memory device as claimed in claim 14, after forming the insulating layer further comprising:

removing a portion of the insulating layer in the memory cell array region; and planarizing remaining insulating layer in a CMP process.

23. A method of fabricating a semiconductor memory device as claimed in claim 14, wherein the insulating layer is selected from a group consisting of a FOX, TOSZ, USG, BSG, PSG, BPSG, PE-TEOS, FSG, and an HDP layer.

24. A method of fabricating a semiconductor memory device as claimed in claim 23, wherein the dummy pattern comprises a multiple layer of a polysilicon layer and a TiN layer, wherein the insulating layer comprises a PE-TEOS layer.

25. A method of fabricating a semiconductor memory device as claimed in claim 14, wherein the insulating layer is formed in a process selected from a group consisting of an ALD, PEALD, MOCVD, and a PECVD process.

26. A method of fabricating a semiconductor memory device as claimed in claim 14, wherein the dummy pattern is a line-type pattern.

27. A method of fabricating a semiconductor memory device as claimed in claim 14, wherein the dummy pattern has a thickness that is greater than a thickness of the extended portion of the plate electrode.

28. A method of fabricating a semiconductor memory device as claimed in claim 27, wherein the thickness of the dummy pattern is at least 1.5 times of the thickness the extended portion of the plate electrode.

* * * * *